United States Patent
Sauer et al.

(10) Patent No.: US 6,302,372 B1
(45) Date of Patent: Oct. 16, 2001

(54) GATE VALVE

(75) Inventors: Andreas Sauer, Hösbach; Manfred Schuhmacher, Alzenau/Michelbach; Johannes Kunz, Hasselroth; Gerhard Joos, Niedernberg, all of (DE)

(73) Assignee: Beybold Systems GmbH, Hanau (DE)

( * ) Notice: Subject to any disclaimer, the term of this patent is extended or adjusted under 35 U.S.C. 154(b) by 0 days.

(21) Appl. No.: 09/455,175

(22) Filed: Dec. 6, 1999

(30) Foreign Application Priority Data

Dec. 11, 1998 (DE) .............................. 198 57 201

(51) Int. Cl.⁷ ...................................................... F16K 3/18
(52) U.S. Cl. .............................. 251/167; 251/195; 251/62
(58) Field of Search ................................. 251/158, 167, 251/193, 195, 197, 62

(56) References Cited

U.S. PATENT DOCUMENTS

| | | | |
|---|---|---|---|
| 2,496,451 | * 2/1950 | Eichenberg | 251/195 X |
| 4,052,850 | * 10/1977 | Mohaupt | 60/327 |
| 4,157,169 | * 6/1979 | Norman | 251/195 |
| 4,418,646 | 12/1983 | Zajac | 118/733 |
| 5,087,017 | * 2/1992 | Sawa et al. | 251/195 X |
| 5,157,851 | 10/1992 | Younan | 34/242 |
| 5,269,491 | * 12/1993 | Reynolds | 251/195 |
| 5,755,255 | * 5/1998 | Iwabuchi | 251/158 X |
| 5,975,492 | * 11/1999 | Brenes | 251/193 X |

FOREIGN PATENT DOCUMENTS 0 060 626  9/1982 (EP).

OTHER PUBLICATIONS

Patent Abstracts of Japan, Publication No. 07 062 537 A, published Mar. 7, 1995.

* cited by examiner

Primary Examiner—Joseph A. Kaufman
Assistant Examiner—Eric Keasel
(74) Attorney, Agent, or Firm—Smith, Gambrell & Russell, LLP

(57) ABSTRACT

A gate valve (1) is constructed for the simultaneous blocking or clearing of two rectangular passage openings (8,9) of two chamber walls (4,5) that are provided between two vacuum chambers (1,3) and aligned with one another. To this end, it has two valve plates (20, 21), which are a component of a slider (15), which is situated so that it can move with play from a position clearing the passage openings (8,9) to a position which closes the passage openings (8,9). To move the valve plates (20,21) to the closing setting against the passage openings (8,9) on the slider (15), at least one lifting element (24), which is acted on by pressure, is provided.

10 Claims, 6 Drawing Sheets

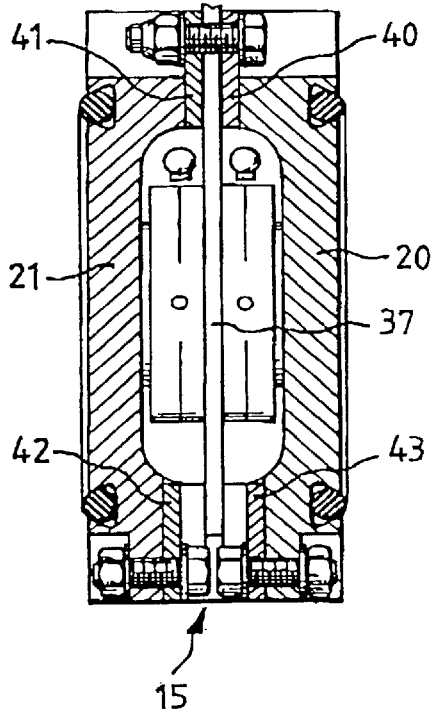
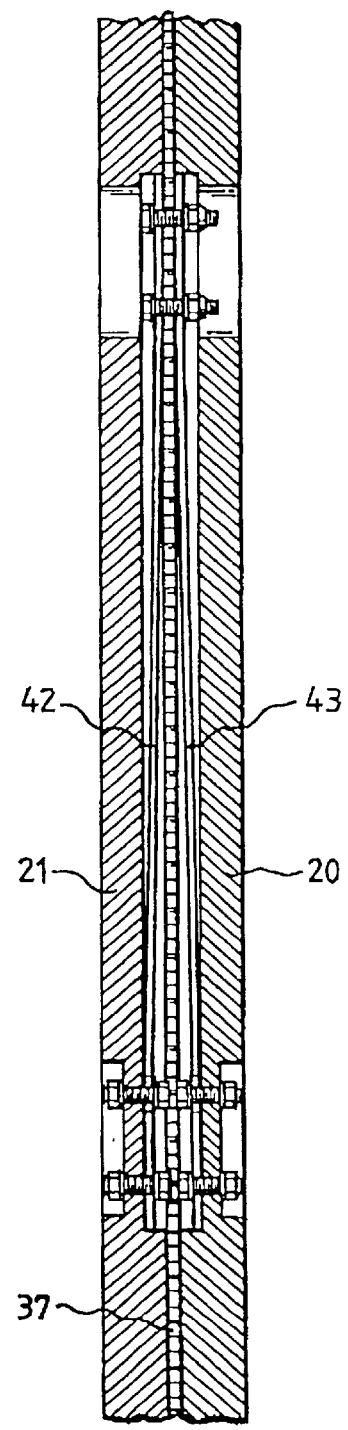

GATE VALVE

INTRODUCTION AND BACKGROUND

The present invention concerns a gate valve to simultaneously shut off or clear two rectangular passage openings that are provided between two vacuum chambers which are aligned with one another and which have a low height and a large width on the order of magnitude of up to several meters, wherein the gate valve has two valve plates opposite one another to close the passage openings.

Gate valves of the preceding type are needed, for example, in sputtering units in which glass passes several vacuum chambers placed one behind the other to be coated with an antireflection layer, for example, by sputtering. In such production units several vacuum chambers are constructed mostly as sputtering chambers. A one-gate chamber and many times also a buffer chamber are connected upstream from it, such that it is necessary for the glass to be able to move into the pertinent chamber via passage openings that can be closed.

Up to now the passage openings have been closed by flaps or traditional sliders. Since the passage openings, however, can be several meters wide, in the manufacturing of glass, for example, the sealing of such flaps or sliders causes difficulties. With flaps there is the problem that their swivel axis must run precisely parallel to the passage opening so that the flap lies uniformly against the sealing over its entire length. With sliders there is wear and tear due to the friction of the sliders on the seals and thus there are leaks in the course of time.

Therefore, it is an object of the invention to overcome the problem of constructing a gate valve of the type described herein so that, with the least possible expense, a reliable sealing is attained and its tightness is impaired as little as possible by wear and tear.

SUMMARY OF THE INVENTION

The above and other objects of the invention can be achieved by having the valve plates as a component of a slider that is placed so that it can move with free play from a position that clears the passage openings into a position which closes the passage openings, and by having at least one pressure-impinged lifting element on the slider to move the valve plates to the closing position.

When a slider moves in front of the passage openings to be sealed off or when clearing these passage openings, such a slider does not have to move along the seals. Therefore, there is no wear and tear of the seals because of the slider movements. Since the valve plates move toward the passage openings only after the movement of the slider, the seals on the valve plates are merely compressed, so that a sliding friction leading to wear and tear is avoided. At the same time, the lifting of the valve plates directed toward the passage openings makes it possible for them to adapt to the course of the passage openings or a component near there, so that alignment errors between the slider and the passage opening can be compensated for. Instead of providing the gate valve with two opposite valve plates, it is also possible to have an embodiment with a valve plate and a counterplate.

BRIEF DESCRIPTION OF DRAWINGS

The present invention will be further understood with reference to the accompanying drawings which illustrate embodiments of the invention and wherein:

FIG. 6 is a partial vertical section view through another embodiment of the gate valve in the area of its slider; and FIG. 7 is a partial horizontal section view through the gate valve in the area of its leaf springs carrying the valve plates.

DETAILED DESCRIPTION OF INVENTION

Figure 1:
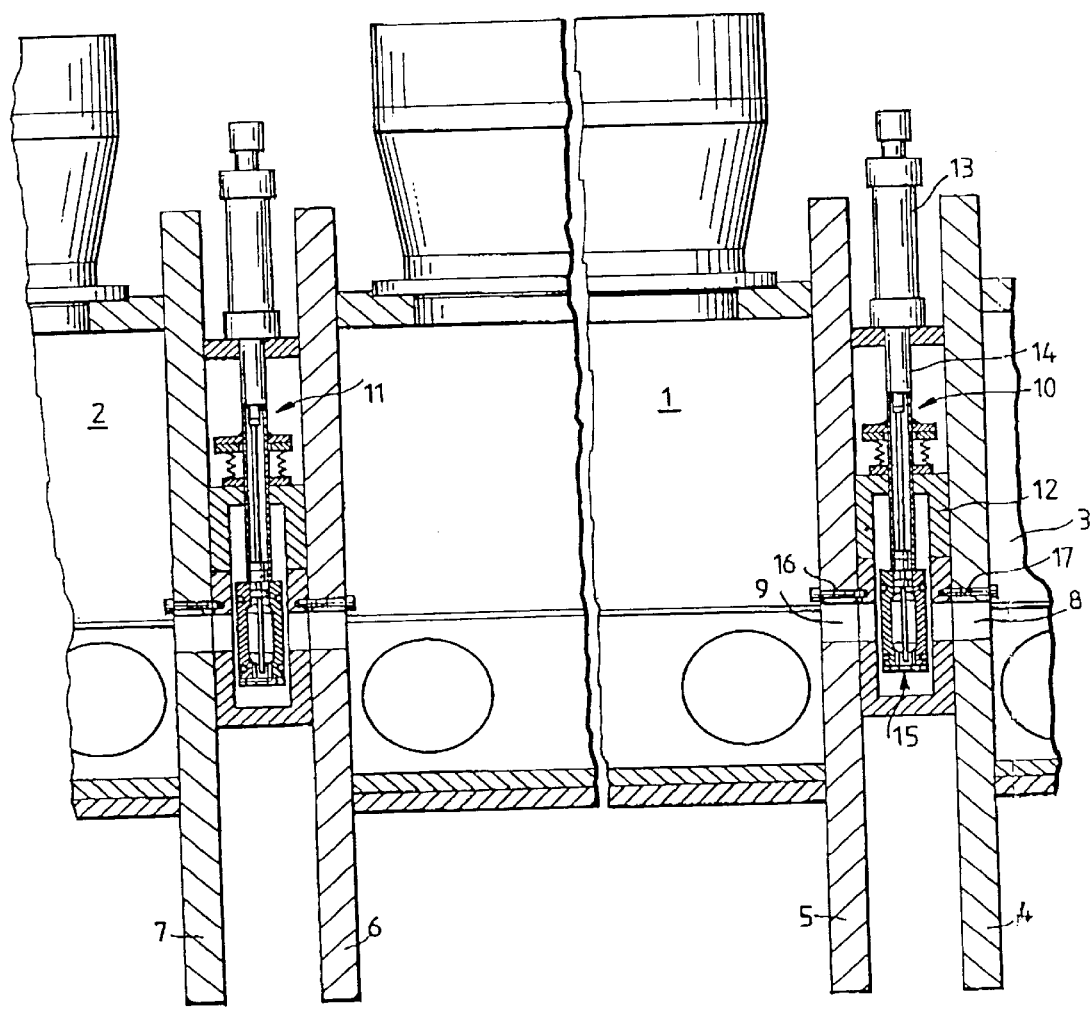
FIG. 1 is a partial longitudinal section view through a partial area of a coating unit for glass with the gate valve, in accordance with the invention.

An advantageous refinement of the invention is to be found in that the slider has a middle basic element on which the valve plates are held with leaf springs in a prestressed position with respect to the basic element. Such leaf springs make it possible for the valve plates to retract by themselves to their starting position after a pressure impingement of the lifting element, and then they no longer lie against the wall surfaces so that when the slider moves away friction does not appear between the valve plates and the wall surfaces.

The gate valve has a particularly simple and space-saving construction if the leaf springs run in the longitudinal direction of the basic element, and are each affixed near one end on the basic element and near the other end on one of the valve plates. In this way the gate valve can be designed particularly narrow such that the two adjacent vacuum chambers can be placed correspondingly close behind one another.

The lifting element is able to press uniformly against the valve plates over the entire length of the valve plates if it is an elastically deformable hose extending over approximately the length of the valve plates; the hose lies with a partial area of its outer surface against the valve plates over its length.

Alternatively, however, it is also possible for the lifting element to be formed by several pneumatic cocking cylinders, placed over the length of the valve plates on the basic element; they are connected to a common pressure medium supply conduit. Such cocking cylinders can be obtained on the market for other application purposes so that in this embodiment one can have recourse to low-cost components.

The pressure medium supply for the lifting element can be implemented in a simple manner in that along the basic element a pressure distribution conduit is located connected to the pressure medium supply conduit from which a branch conduit between two cocking cylinders leads to the two cocking cylinders.

The slider is designed in a particularly simple manner, if a pressure distribution conduit, connected to the pressure medium supply conduit, runs in the basic element with the conduit having outlets over the length of the valve plates leading into a cocking cylinder.

The walls of the vacuum chambers do not have to be aligned exactly with one another and do not have to have an exactly plane surface on the side of the gate valve if the slider is located in a slider housing that is situated between the vacuum chambers, and has a passage surrounded by an enclosing sealing that is directed toward the vacuum chamber and which corresponds to the passage opening.

If the slider housing is constructed pressure-tight and has connections to alternate action with atmospheric pressure or reduced pressure, the pressing force of the valve plates against the individual chamber wall or against the slider housing can be increased in a simple manner by a counter-pressure action.

The maintenance of the gate valve is particularly simple if, in accordance with another refinement of the invention, the slider housing is constructed for an attachment with the vacuum chambers detachable by means of screws.

The mechanism for activating the slider is designed particularly inexpensively if two lifting cylinders are located on the upper side of the slider housing; they lead into the slider housing using a piston rod, and are connected with the slider there.

The sealing of the piston rods with respect to the slider housing can also be constructed without sliding friction in that the piston rod is sealed off with respect to the slider housing by expansion bellows firmly affixed to the piston rod and the slider housing.

The supply of compressed air to the lifting element involves only a low constructive outlay if the piston rod has a pressure medium canal to supply the compressed air to the lifting element.

The gate valve can be cleaned in a particularly easy manner in maintenance work if, in accordance with another refinement of the invention, the slider housing has a cleaning opening—on at least one front side—which can be closed by a lid.

The gate valve with the aforementioned features, in accordance with the invention, can be constructed extremely narrow and using lightweight construction. It is not only suitable for enabling the sluicing in and out of substrates, but it can also be placed between sputtering chambers connected in series to block them individually, so that for maintenance purposes one can place individual vacuum chambers under atmospheric pressure without flooding the entire unit.

Turning now to the drawings, in a coating unit for glass, FIG. 1 shows a vacuum chamber 1 designed as a sputtering chamber; and adjacent to it, partially, another vacuum chamber 2 constructed as a sputtering chamber also; and likewise partially, a vacuum chamber 3 upstream from the vacuum chamber 1 and used as a buffer chamber. The vacuum chambers 1, 2, and 3 are limited on the front side by chamber walls 4, 5, 6, 7 that have passage openings 8, 9, aligned with one another. While operating the unit, two adjacent vacuum chambers are alternately under a vacuum.

A gate valve 10,11 is located between the chamber walls 4, 5, 6, 7; it is able to clear or close the passage openings 8, 9. Each of these gate valves 10,11 has a slider housing 12 on which a lifting cylinder 13 is located, serving as a slider drive. The lifting cylinder 13 has a piston rod 14 that leads into the slider housing 12 and which carries a slider 15 within the slider housing. The detachable slider housing is connected with the chamber walls 4, 5 by means of screws 16, 17.

Figure 2:
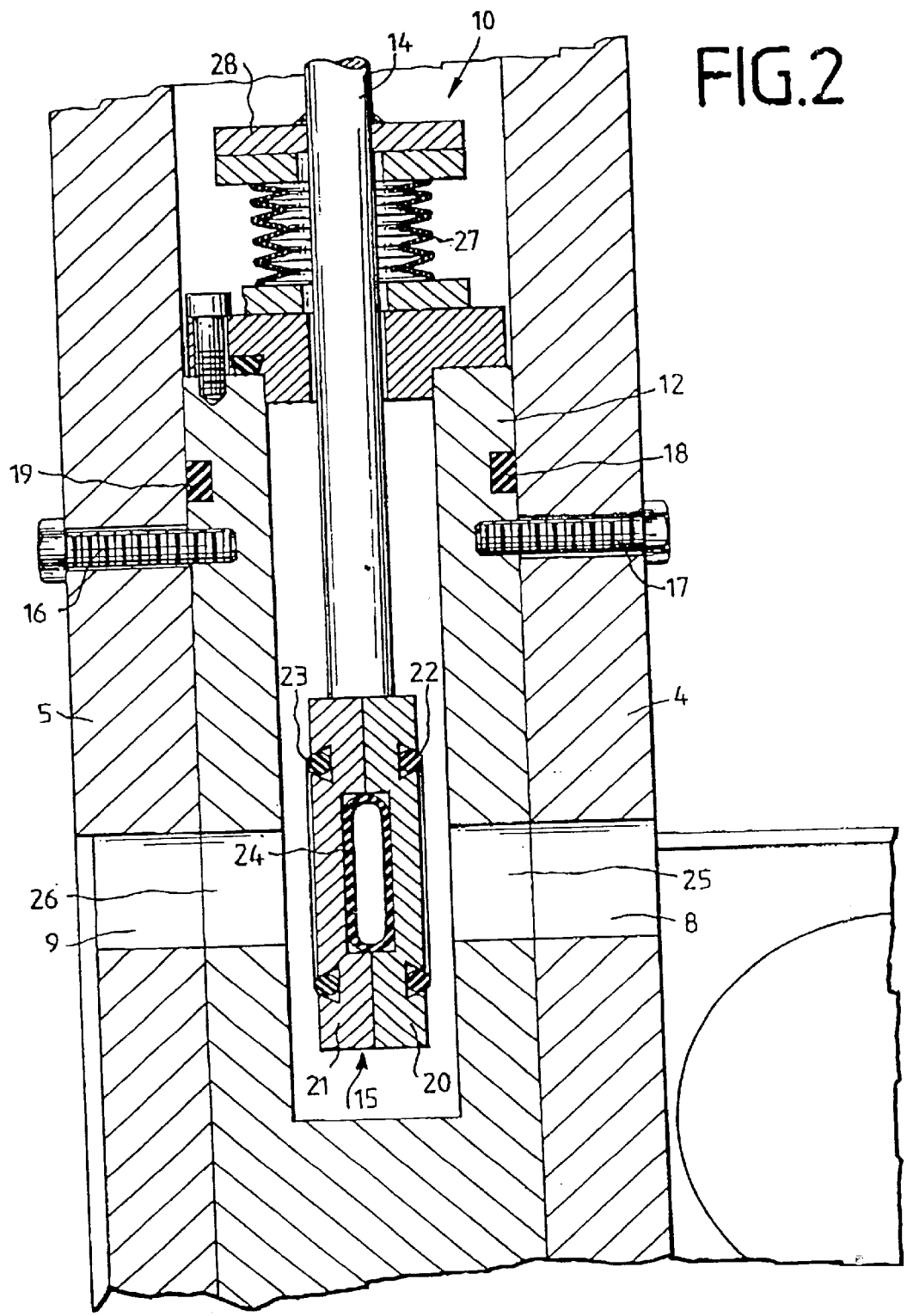
FIG. 2 is a partial vertical section view through a partial area of the gate valve.

FIG. 2 illustrates the design of the gate valve 10. Its slider housing 12 is adjacent to the pertinent chamber wall 4, 5, with seals 18, 19, providing such a sealing effect that the passage openings 8, 9 are enclosed airtight. The slider housing 12 has passages 25, 26 that are aligned with the passage openings 8, 9. At the lower end of the piston bar 14, one can see the slider 15 within the slider housing 12. This has two valve plates 20, 21 opposite one another, which also have surrounding seals 22, 23, and can be moved against the slider housing 12 by means of a hose-shaped lifting element 24 placed between the valve plates 20, 21 such that the passages 25, 26 are closed, and therefore the passage openings 8, 9 are also closed.

The sealing between the piston rod 14 and the slider housing 12 takes place by means of expansion bellows 27 which is affixed on the slider housing 12 and on the flange 28 that is firmly connected to the piston rod 14.

Figure 3:
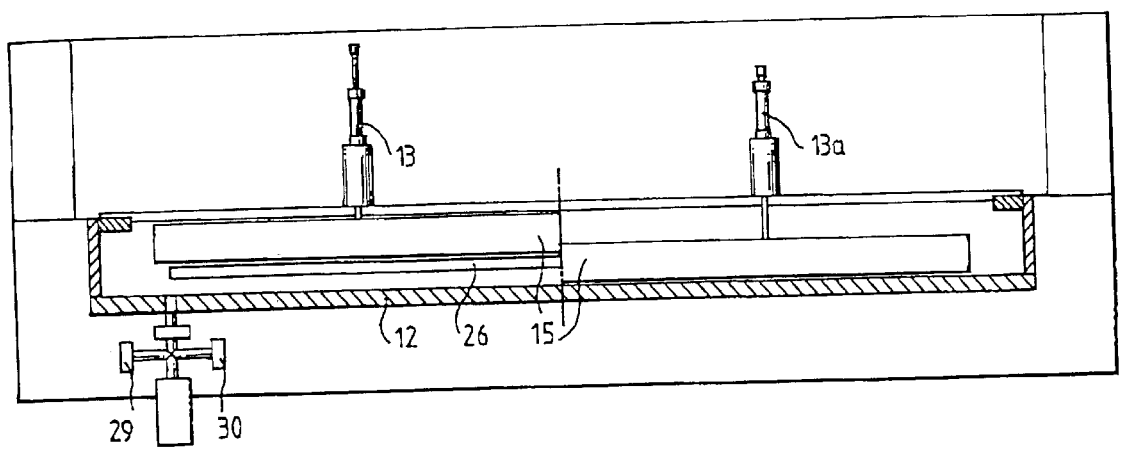
FIG. 3 is a partial cross section view through a gate valve.

FIG. 3 shows the slider 15 within the slider housing 12 in the left part of the figure in its upper position of the closing setting, and in the right part of the figure in its lower position. Therefore, the passage 26 cleared by the slider 15 can be seen in the left part of the figure. Two lifting cylinders 13, 13a that carry the slider and make possible its vertical movements can be seen on the slider housing. The slider housing 12 is constructed pressure-tight and has two connections 29,30, via which it can be acted on, alternately with reduced pressure or atmospheric pressure. When acted on with atmospheric pressure, the closing force of the gate valve 10, 11 can be increased. If the lifting element 24 is connected with reduced pressure during the opening of the gate valve 10, 11, then the opening of the gate valve 10, 11 is facilitated.

Figure 4:
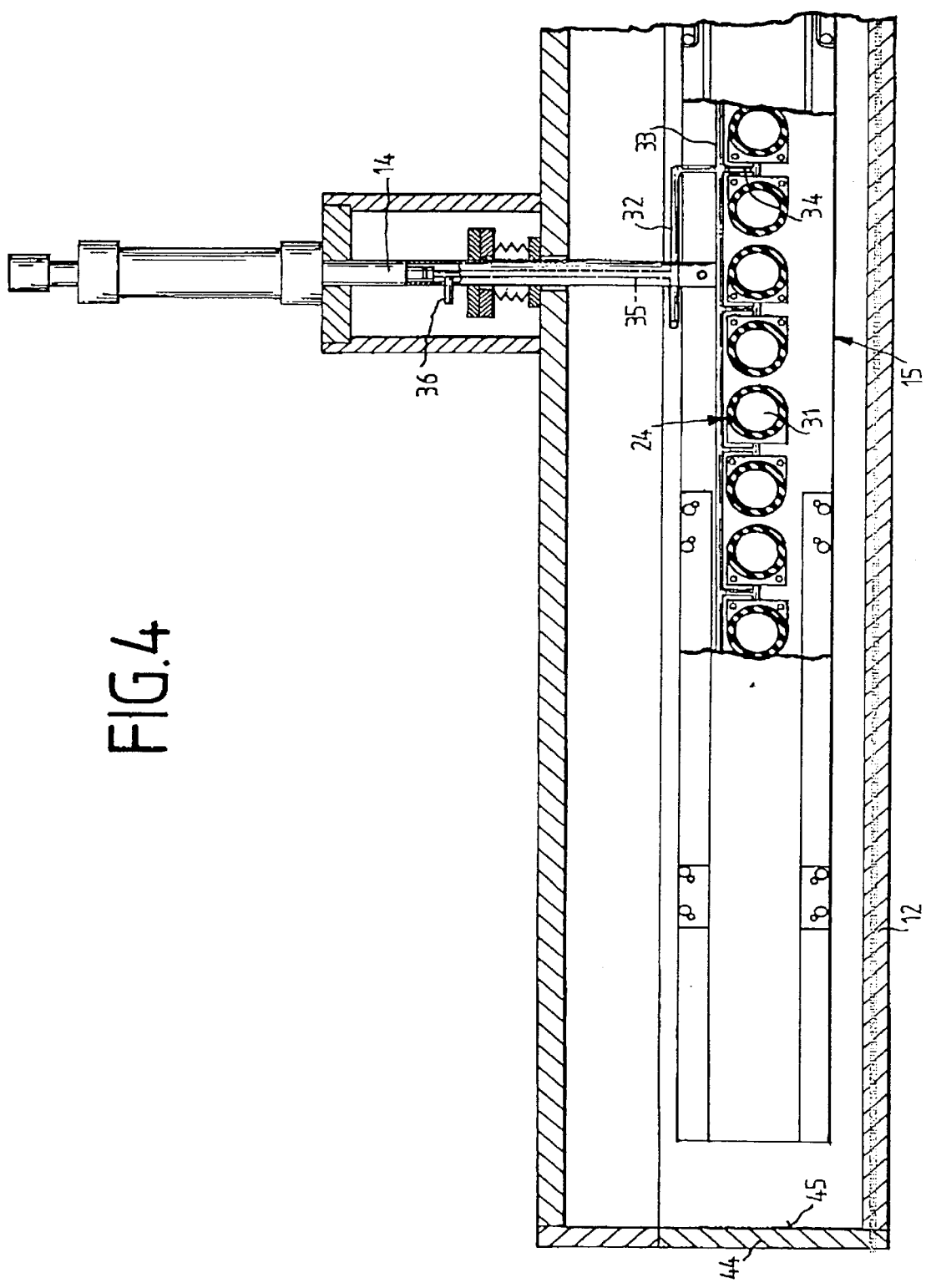
FIG. 4 is a partial cross section view through a partial area of a second embodiment of the gate valve.

In the embodiment in accordance with FIG. 4, the lifting element 24 consists of a large number of individual cocking cylinders 31 arranged in a row. For its pressure medium supply, a supply conduit 32 that leads to a pressure distribution conduit 33 is used. Branch conduits 34 lead from the pressure distribution conduit 33 to two cocking cylinders 31. The pressure medium supply conduit 33 is connected to a pressure medium canal 35 in the interior of the piston rod 14, to which compressed air can be conducted via a pressure medium connection 36. To clean the slider housing 12, there are cleaning openings 45 which are closed by a lid 44 on the front sides.

Figure 5:
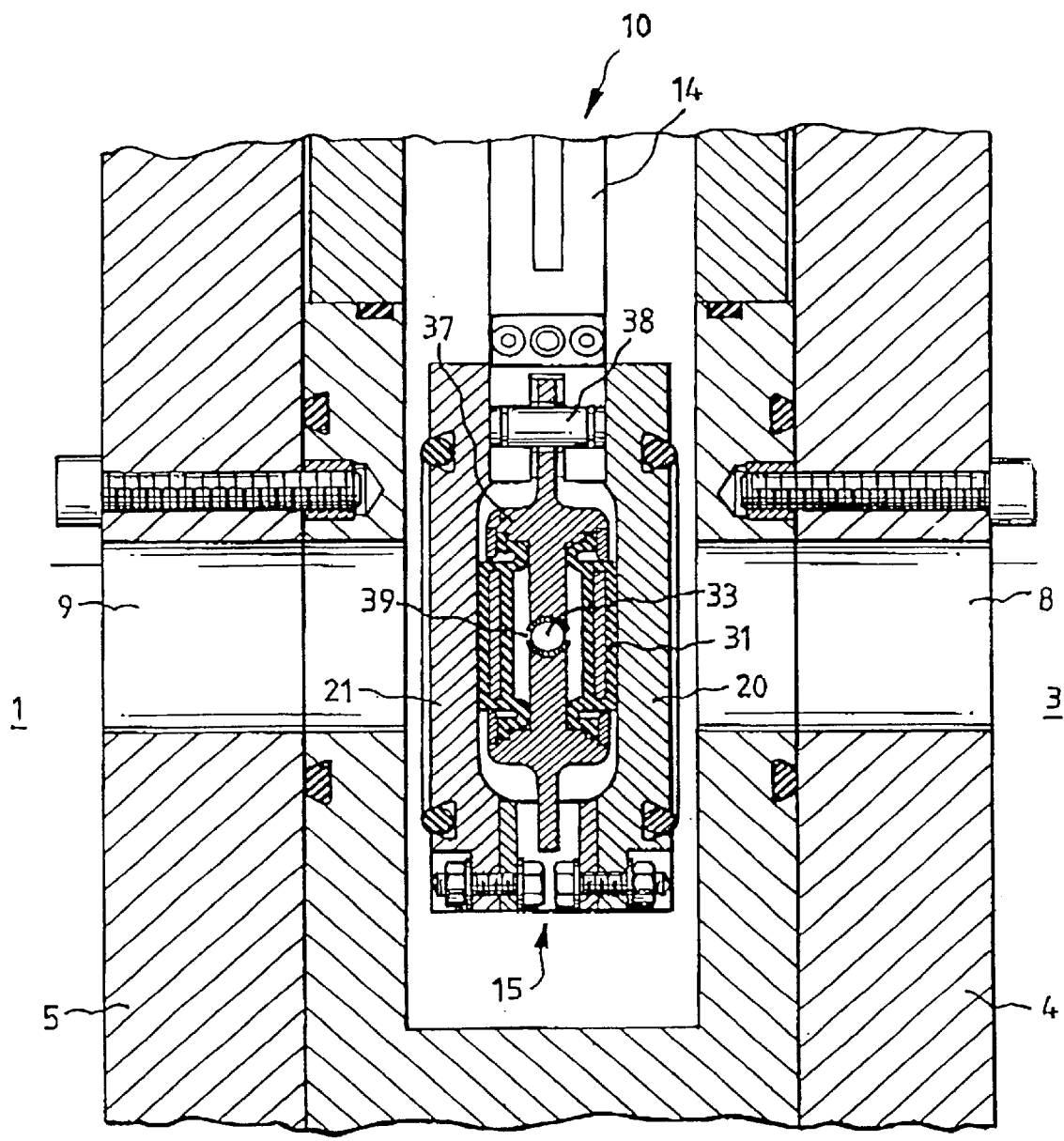
FIG. 5 is a partial vertical section view through a third embodiment of the gate valve.

FIG. 5 shows a basic element 37 which is affixed to the piston rod 14 by means of a bolt 38. This basic element 37 carries the cocking cylinders 31. The pressure medium distribution conduit 33 runs in the interior of the basic element 37 in this exemplified embodiment and has an outlet 39 to the individual cocking cylinders 31 by which air can reach the cocking cylinders 31.

The individual cocking cylinders 31 can be affixed individually on the basic element 37) so that in case of a defect of a cocking cylinder 31, they can be separately replaced.

In the embodiment according to FIG. 6, the basic element 37 is constructed as a flat middle plate. The valve plates 20, 21 are connected with the basic element 37 by flat leaf springs 40, 41, 42, 43 running in the longitudinal direction of the slider 15. As FIG. 7 shows for the leaf springs 42, 43, they are connected with one end to the basic body 37 and with their other end to a valve plate 20,21. They link the valve plates 20, 21 to the basic element 37 so that the valve plates move automatically to their starting position when the acting pressure declines after a pressure medium first acts on them.

Further variations and modifications of the foregoing will be apparent to those skilled in the art and are intended to be encompassed by the claims appended hereto.

German priority application 198 57 201.8 is relied on and incorporated herein by reference.

We claim:

1. A gate valve for the simultaneous blocking or clearing of two rectangular passage openings that are aligned with one another and are provided between two vacuum chambers comprising:
    a slider that can move from a position that clears the passage openings into a position that closes the passage openings,
    said slider including two valve plates opposite one another,
    a lifting element for moving the valve plates formed by a plurality of pneumatic cocking cylinders arranged over the length of the valve plates cylinders
    said pneumatic cocking cylinders are connected to a common pressure medium supply conduit.

2. The gate valve according to claim 1, wherein a pressure distribution conduit, connected to the supply conduit, is located along the slider, between two cocking cylinders, a branch conduit from a distribution conduit leads to two cocking cylinders.

3. The gate valve according to claim 1, wherein a pressure distribution conduit runs within the slider, which has outlets leading into a cocking cylinder over the length of the valve plates.

4. The gate valve according to claim 1, wherein said slider is located in a slider housing situated between the vacuum chambers; and on two opposite sides, the housing has a passage, which corresponds to the passage openings and is surrounded by enclosing seals, directed to the vacuum chambers.

5. The gate valve according to claim 4, wherein the slider housing is constructed pressure-tight and has connections for alternate action with atmospheric pressure and reduced pressure.

6. The gate valve according to claim 4, wherein the slider housing is detachably affixable to said vacuum chambers by means of screws.

7. The gate valve according to claim 1, wherein at least one lifting cylinder is located on an upper side of a slider housing; said at least one lifting cylinder extends into the slider housing with a piston rod and is connected to the slider.

8. The gate valve according to claim 7, wherein the piston rod is sealed with respect to the slider housing by an expansion bellows that is firmly affixed to the piston rod and to the slider housing.

9. The gate valve according to claim 7, wherein said piston rod has a pressure medium canal for a supply of the compressed air to the lifting element.

10. The gate valve according to claim 7, wherein said slider housing has at least one cleaning opening that can be closed by a lid on at least one front side.

* * * * *